United States Patent [19]

Cheung et al.

[11] Patent Number: 4,693,925
[45] Date of Patent: Sep. 15, 1987

[54] INTEGRATED CIRCUIT STRUCTURE HAVING INTERMEDIATE METAL SILICIDE LAYER

[75] Inventors: Robin W. Cheung, Cupertino; Hugo W. K. Chan, Fremont, both of Calif.

[73] Assignee: Advanced Micro Devices, Inc., Sunnyvale, Calif.

[21] Appl. No.: 822,352

[22] Filed: Jan. 24, 1986

Related U.S. Application Data

[62] Division of Ser. No. 585,340, Mar. 1, 1984, Pat. No. 4,581,815.

[51] Int. Cl.⁴ .................. B32B 3/22; B32B 15/04
[52] U.S. Cl. ............................. 428/189; 427/96; 427/215; 427/219; 427/271; 427/284; 427/286; 428/192; 428/450; 428/457; 428/472; 428/901; 437/225
[58] Field of Search .............. 29/577 C, 589, 590, 29/591; 357/59, 675, 71 S, 71 P; 148/1.5, DIG. 19, DIG. 147, DIG. 133; 427/88, 93, 96, 215, 284, 271, 286, 219; 428/192, 189, 901, 457, 450, 472

[56] References Cited

U.S. PATENT DOCUMENTS

| | | | |
|---|---|---|---|
| 4,276,557 | 6/1981 | Levinstein et al. | 357/71 S |
| 4,356,622 | 11/1982 | Widmann | 357/71 S |
| 4,450,470 | 5/1984 | Shiba | 357/67 S |
| 4,451,328 | 5/1984 | Dubois | 357/67 S |

Primary Examiner—Thomas J. Herbert
Attorney, Agent, or Firm—Patrick T. King; John P. Taylor

[57] ABSTRACT

An improved integrated circuit structure characterized by enhanced step coverage and a method of making it are disclosed. The structure comprises a base layer of silicon, a first oxide layer on the silicon layer, strips of poly silicon having selected portions thereof reacted with a metal capable of forming a metal silicide in situ on the surface of the poly silicon strips, a further oxide layer over the metal silicide, and a metal layer providing electrical contact to selected portions of the structure. The construction makes it possible to remove all of an intermediate oxide layer during manufacture except for an oxide layer above the poly load resistor. This elimination of one oxide layer, together with the integration of the conductive metal silicide and underlying poly silicon into one layer and the rounding of the metal silicide edge with oxide spacers via anisotropic etching of the intermediate oxide layer, permits better step coverage for the resulting structure.

10 Claims, 11 Drawing Figures

INTEGRATED CIRCUIT STRUCTURE HAVING INTERMEDIATE METAL SILICIDE LAYER

This is a division of application Ser. No. 585,340, filed Mar. 1, 1984 and now issued as U.S. Pat. No. 4,581,815 on Apr. 15, 1986.

BACKGROUND OF THE INVENTION

1. Field of the Invention

This invention relates to integrated circuit structures. More particularly, this invention relates to an integrated circuit structure having an intermediate metal silicide layer.

2. Background Art

In the production of integrated circuit structures, such as, for example, static RAM chips, metal step coverage of contacts in the application of the final layers or rear end of the process is less than satisfactory when an intermediate metal layer is used. The presence of such an intermediate metal layer complicates the step coverage problem because higher temperature processing cannot be used to smooth out the step coverage since, if sufficient heat is used to soften the outer oxide layer to smooth out the step, the heat may adversely affect the intermediate metal layer.

Furthermore, it is customary to provide an undoped oxide layer over a polycrystalline silicon (hereinafter referred to as polysilicon or poly) layer having lightly doped portions to provide resistive paths or poly loads. This second, undoped, oxide layer is applied to prevent diffusion of the dopants from getting to the poly load area of the polysilicon layer. The use of an additional doped oxide layer over this oxide layer to provide a lower melting point oxide whereby the step coverage can be smoothed out means that contact openings must penetrate three layers of oxide before contacting the desired portion of the silicon substrate, such as, for example, the drain or source of an MOS transistor. This, in turn, can provide in adequate metal coverage in the contact opening resulting in thinning of portions of the metal on the wall of the contact opening.

While the use of an intermediate conductive layer of metal silicide is not unknown, prior uses of such a metal silicide have been made by concurrently sputtering silicon and a refractory metal to form a metal silicide layer which, after selective etching, is covered by a polysilicon layer. Subsequent doping of the poly layer results in the formation of resistive paths between the metal silicide portions. However, this use of two conductive layers provides a further step which must be covered during the subsequent application of further layers.

SUMMARY OF THE INVENTION

It is an object of the invention to provide an improved integrated circuit structure and a process for making the structure wherein a metal silicide layer replaces a metal layer to permit higher temperature processing of subsequently applied layers.

It is another object of the invention to provide an improved integrated circuit structure and a process for making the structure wherein a metal silicide layer is used beneath a doped oxide layer instead of a metal layer whereby a subsequently applied doped oxide layer may be softened at high temperature to provide better step coverage without interfering with the underlying conductive layer of metal silicide.

It is yet another object of the invention to provide an improved integrated circuit structure and a process for making the structure wherein the use of an intermediate metal silicide layer eliminates an intermediate oxide layer from the contact area thereby reducing the thickness of oxide layers which must be removed by a subsequent contact etch whereby better step coverage is provided.

It is a further object of the invention to provide an improved integrated circuit poly load structure and a process for making the structure wherein a metal silicide interconnection layer is formed in situ by selective reaction with a polysilicon layer in areas unmasked by oxide. The metal silicide layer is connected to the poly load structure masked by the oxide, eliminating the need for an additional interconnect layer.

It is yet a further object of the invention to provide an improved integrated circuit structure and a process for making the structure wherein an intermediate metal silicide layer is provided having rounded oxide corners formed by anisotropic etching to provide better step coverage when subsequent layers are applied.

It is a still further object of the invention to provide an improved integrated circuit structure wherein conductive paths are formed in poly silicon, previously doped to provide a preselected resistivity and patterned to form strips, by the in situ formation of metal silicide with a portion of said polysilicon strips whereby poly load resistors are formed which are connected at their ends with portions of the conductive metal silicide.

These and other objects of the invention will be apparent from the drawings and description of the preferred embodiments.

DESCRIPTION OF THE PREFERRED EMBODIMENT

Figure 1A:
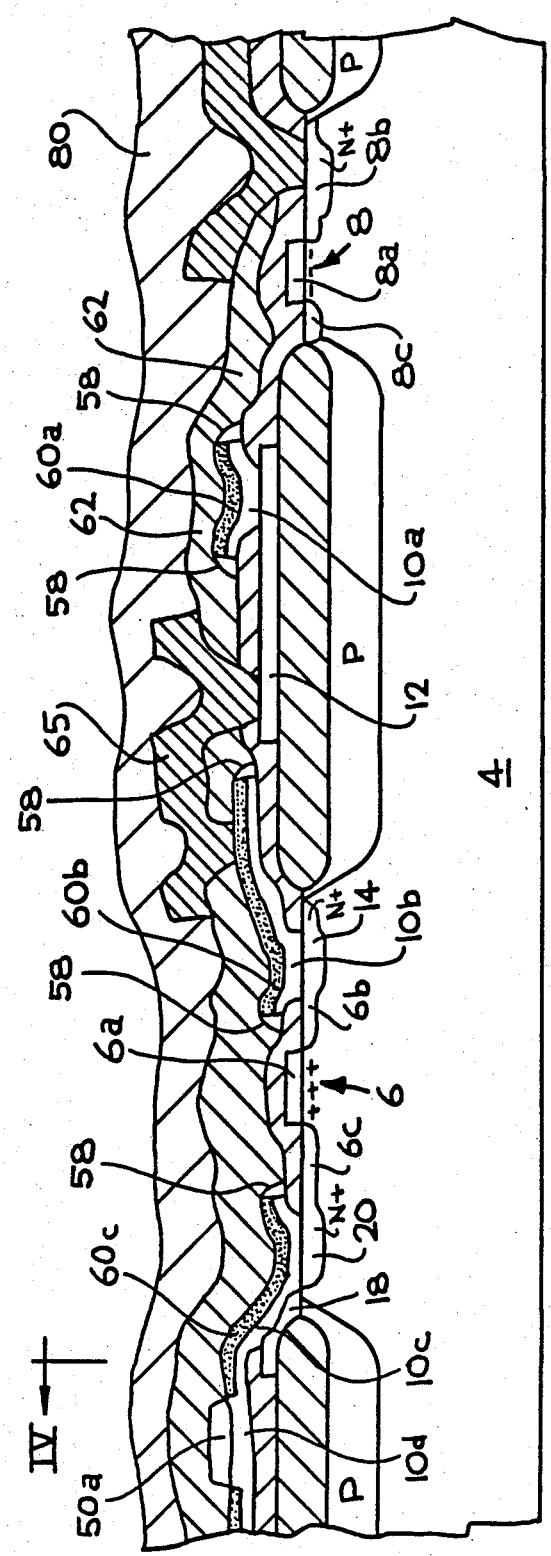
FIG. 1A is a sectional view of a portion of an integrated circuit device constructed in accordance with the invention.
Figure 1B:
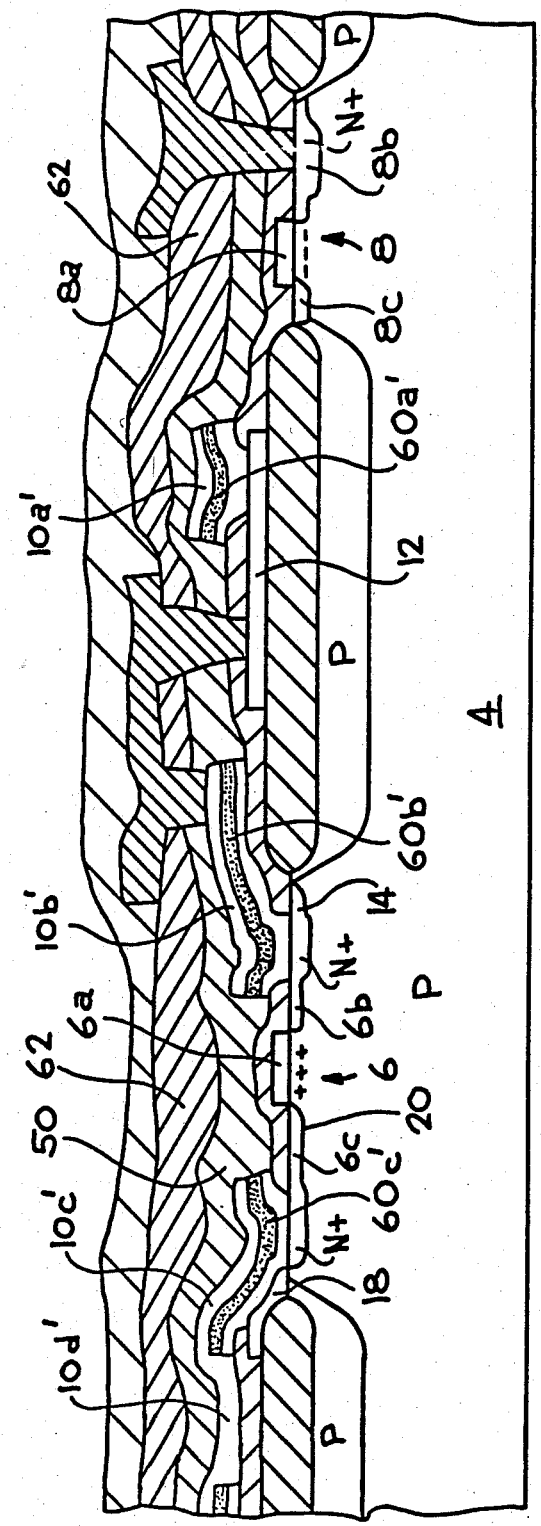
FIG. 1B is a sectional view of an integrated circuit device constructed in accordance with the prior art.

FIG. 1A illustrates an integrated circuit structure utilizing the invention in contrast to an integrated circuit structure having the same active and passive components formed therein in accordance with the prior art as shown in FIG. 1B.

In both FIGS. 1A and 1B, a silicon wafer or substrate 4 has formed thereon an enhancement mode field effect transistor (FET) 6 and a depletion mode FET 8. FET 6 has a gate 6a, a source 6b, and a drain 6c.

FET 8 has a gate 8a, a source 8b, and a drain 8c. Metal silicide segments 60a, 60b, and 60c of FIG. 1A, in accordance with the invention, overlay polysilicon segments 10a, 10b, and 10c which overlaying segments together make connection to various portions of the circuit. Segments 10a/60a make connection to a polysilicon segment 12 which may, for example, be a word line in a static RAM cell. Segments 10b/60b make connection to a portion 14 of the N+ layer contiguous with source 6b. Portion 14 may, for example, be a voltage supply line with segments 10b/60b providing a low resistance strap. Segments 10c/60c provides a low resistance quasi-buried contact (QBC) of a polysilicon segment 18 to a portion 20 of the N+ layer contiguous with drain 6c. It will be immediately noticed that oxide layer 50 in prior art FIG. 1B has been eliminated in FIG. 1A except in the poly load area where this layer is designated as 50a.

It will also be noted that polysilicon segments 10a', 10b', and 10c' respectively overlay metal silicide segments 60a', 60b', and 60c' in prior art FIG. 1B while the metal silicide segments 60a, 60b, and 60c overlay polysilicon segments 10a, 10b, and 10c in FIG. 1A. This is because the metal silicide layer, in the system of the invention, is formed in situ by depositing, on the surface of the polysilicon, a layer of a metal, such as titanium capable of reacting with the silicon, and then subsequently, sintering the materials to form titanium silicide in situ on the surface of the polysilicon layer. In the prior art practice exemplified by FIG. 1B, the metal silicide layer is first applied by codepositing silicon and the metal portion of the silicide to form the metal silicide layer after which the polysilicon layer is applied. Thus, in the prior art, two distinct layers are applied to the substrate; first the metal silicide layer and then the polysilicon layer. In the practice of the invention, the metal silicide forms in situ on the surface of the previously laid down and patterned polysilicon segments or strips without forming an extra layer from the standpoint of additional thickness.

In accordance with the invention, the metal silicide layer is formed by first patterning a deposited layer of polysilicon over the substrate and any previous layers thereon followed by application of a metal, such as a refractory metal, capable of reacting with the polysilicon to form the metal silicide. Examples of such metals include titanium, molybdenum, and tungsten.

The metal is preferably also one that is easily applied to the polysilicon as by sputtering or vapor deposition.

The metal used should be further capable of reacting with the polysilicon at a temperature of from about 600°-800° C., i.e., high enough to permit diffusion of the silicon into the metal reactant to form silicide, yet low enough to inhibit unwanted diffusion of the silicon to other parts of the device (e.g., the gap between two patterned polysilicon lines).

After the application of the metal coating over the silicon, the device is heated in a heat pulsed sintering environment to a temperature of about 600°-800° C. and held at this temperature for from 10 to 20 seconds to permit reaction to occur forming the metal silicide while inhibiting the side diffusion of silicon.

The resultant metal silicide should have a resistivity of less than 5 ohms per square.

It should be noted here that it is preferable that not all of the polysilicon on which the metal deposits, react with the metal to form the desired metal silicide layer. It has been found that a small remaining layer of poly beneath the metal silicide serves to strengthen the metal silicide layer. Preferably, after reaction, the remaining poly should have a thickness of about 0.25 to 0.33 that of the silicide. To achieve this, the ratios of amounts of poly to metal deposited thereon must be controlled. The thickness ratio of silicon to metal should be kept to a 3:1 ratio or higher to provide the desired final ratio of silicide to poly.

FIGS. 2A–2G are cross-sectional views which illustrate the processing steps used in fabricating a typical N channel device utilizing the invention such as the device shown in FIG. A. As will be shown in FIG. 3, other devices can also be constructed utilizing the invention;, the devices illustrated in FIGS. 1A, 2A–2G, and 3 being only representative of the invention.

Representative process and characteristic parameters such as dopant concentration, implantation depth, layer thickness, and electrical resistance are tabulated in Appendices 1–3 below.

Figure 2A:
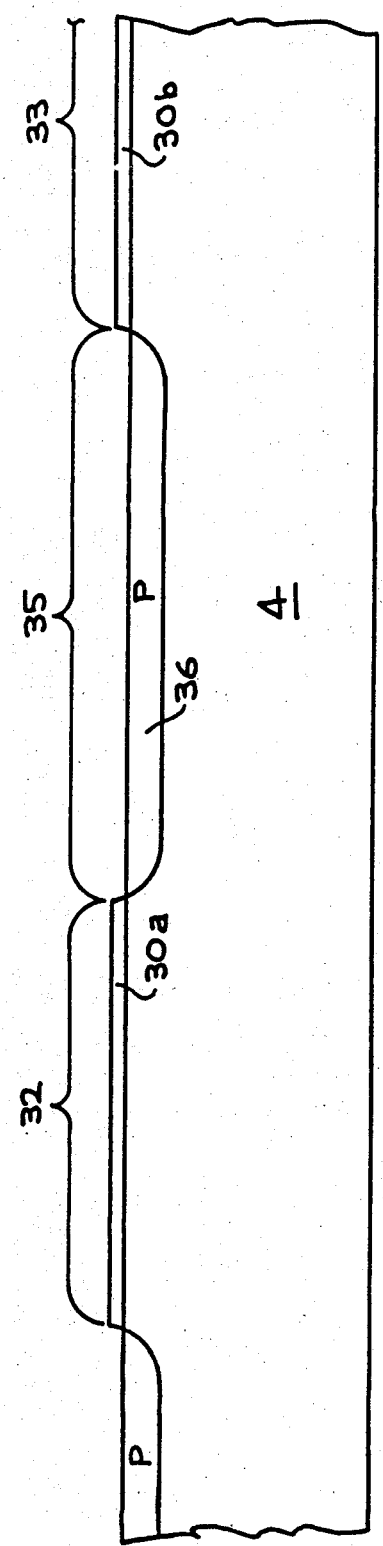
FIGS. 2A–2G are sectional views of the process steps performed to arrive at the structure of FIG. 1A.

FIG. 2A shows wafer 4 after it has been subjected to the following steps:
preoxidation,
barrier oxidation,
nitride deposition,
source/drain mask, and
field doping.

More particularly, a thin barrier oxide layer is deposited by heating the wafer in an oxygen atmosphere, and a silicon nitride layer is then deposited by standard techniques. The source/drain regions are masked by selectively removing portion of the nitride layer and underlying oxide layer leaving nitride/oxide layer segments 30a and 30b over respective regions 32 and 33 to define the source/drain mask. The region 35 that is not masked is then subjected to the ion implantaton of a P-type impurity to define a channel stop region 36.

Figure 2B:
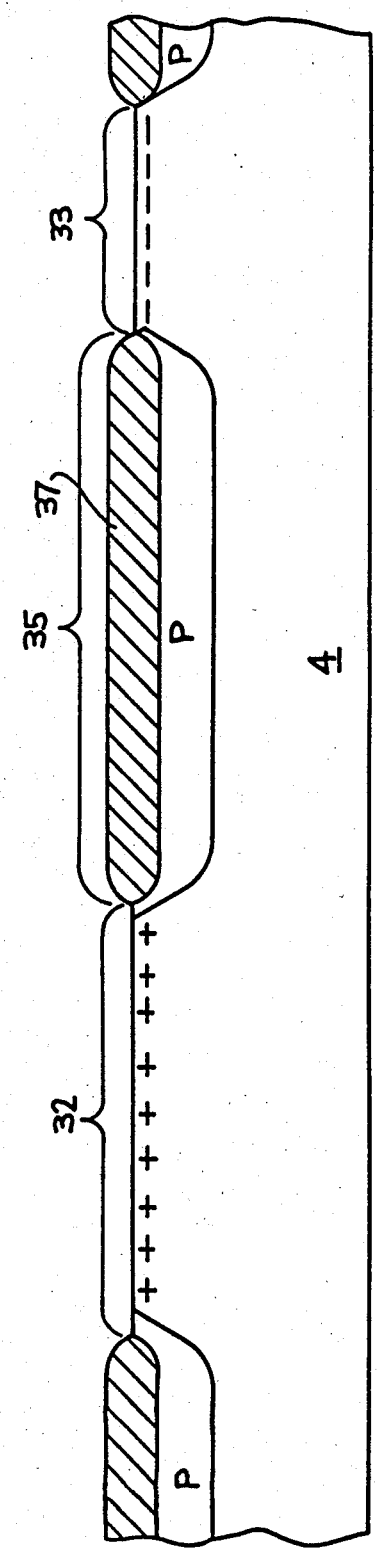

FIG. 2B shows wafer 4 after it has been subjected to the following additional steps:
field oxidation,
implant oxidation I,
enhancement mask and doping,
depletion mask and doping, and
gate oxidation.

More particularly, a field oxide layer 37 is formed from region 35 by heating the wafer in an atmosphere of steam. The nitride/oxide mask that defines region 35 is then removed by a chemical wet etch and Kooi ribbon oxidation. Prior to doping regions 32 and 33, a very thin oxide layer (not shown) is grown to randomize the ion implantation. In a series of mask layer deposition and definition steps, region 32 then has P-type impurities implanted while region 33 has N-type impurities implanted. Portions of the implanted layers within regions 32 and 33 will ultimately define the channels for FETs 6 and 8. After these enhancements and depletion region definition and implantation steps, a gate oxide layer is grown over regions 32 and 33 by heating the wafer in an atmosphere of oxygen and hydrogen chloride. This gate oxide layer, being very thin, is not illustrated.

Figure 2C:
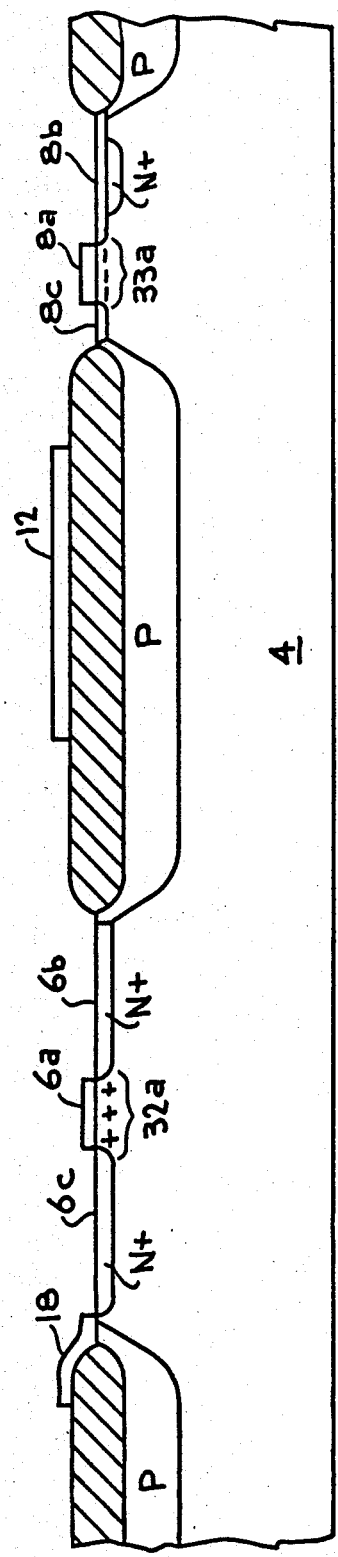

FIG. 2C shows wafer 4 after it has been subjected to the following additional steps:
polysilicon (gate) deposition and doping,
polysilicon (gate) definition,
implant oxidation II, and
source/drain doping and annealing.

More particularly, a polysilicon layer is deposited by a chemical vapor deposition ("CVD") process, and phosphorus added by deposition and diffusion by heating in an atmosphere of phosphorus oxychloride or by ion implantation. Selected portions are then removed to leave segments 12 and 18 and polysilicon gates 6a and 8a. The portions of regions 32 and 33 not occupied by gates 6a and 8a are then subjected to the implantation of N-type impurities, such as arsenic, to define the source and drain of each of FETs 6 and 8.

Figure 2D:
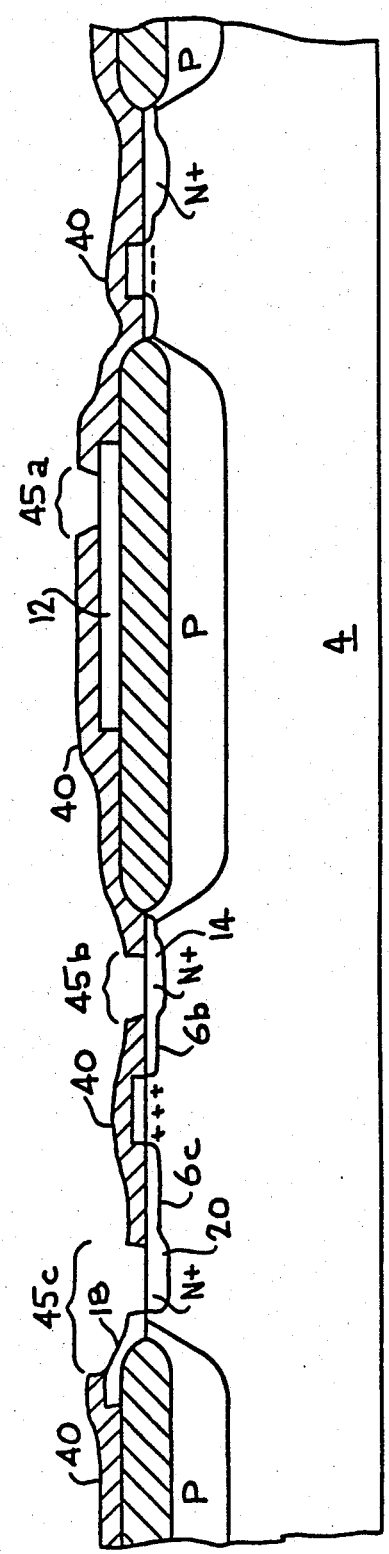

FIG. 2D shows wafer 4 after it has been subjected to the following additional steps:
CVD oxide deposition and densification 1, and
QBC mask.

More particularly, a layer 40 of silicon dioxide is deposited by a CVD process, densified to remove pinholes, and has portions removed over regions 45a, 45b, and 45c to define contact regions. These regions are defined by an etching step which removes the CVD oxide (as well as the thin layer of oxide over N+ layer portions 14 and 20). The opening over region 45a exposes a portion of polysilicon segment 12; the opening over region 45b exposes N+ layer portion 14 that is contiguous with source 6b; and the opening over region 45c exposes a portion of polysilicon layer segment 18 and N+ layer portion 20 in the substrate to define a QBC region.

Figure 2E:
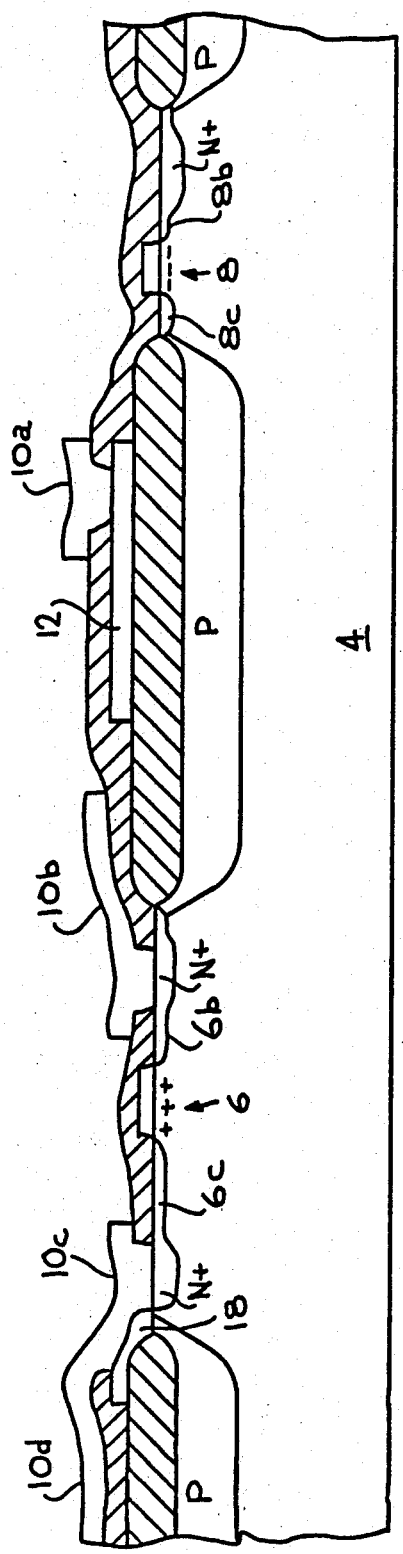

FIG. 2E shows wafer 4 after being subjected to the following steps:
deposition of polysilicon layer,
doping of polysilicon layer, and
masking and selective removal of the polysilicon.

A 1000-3000 angstrom layer of polysilicon is deposited by a chemical vapor deposition (CVD) process. The polysilicon layer is then doped, for example, by ion implantation, with phosphorus, boron, or arsenic to control the resistance of the poly load resistor which will be formed from a portion of this layer. The layer is then masked to define a poly load resistor 10d and contact segments 10a, 10b, and 10c.

Figure 2F:
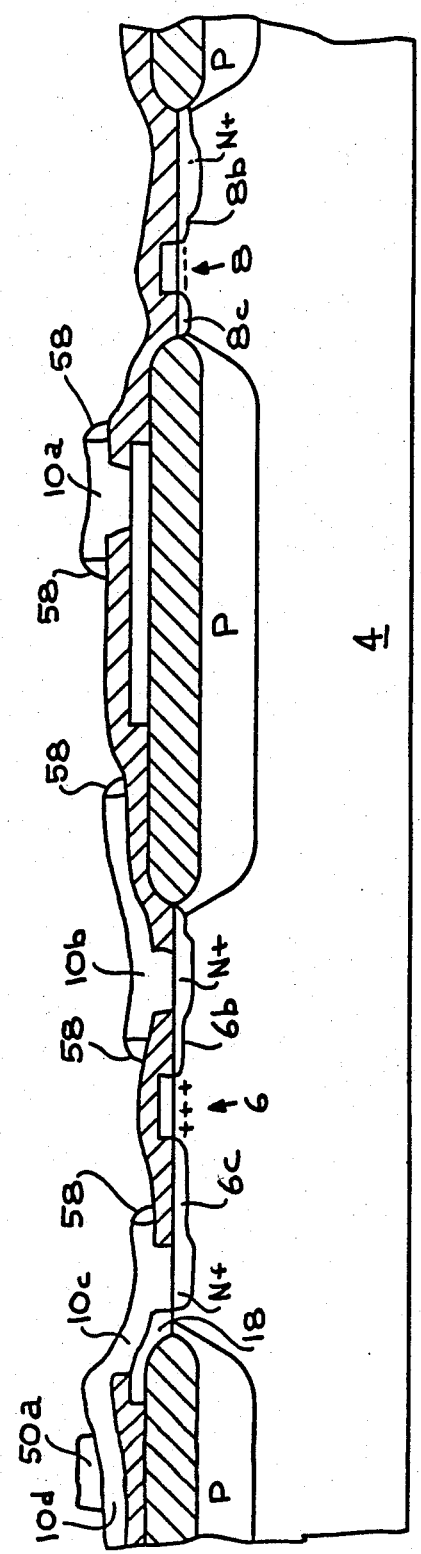

In FIG. 2F a further oxide layer has been deposited on wafer 4 by a CVD process and then masked and selectively etched away to leave only a portion 50a over poly load resistor 10d. It will be particularly noted here that the almost complete removal of this layer of oxide is in contrast to the prior art oxide layer 50 shown in FIG. 1B which is only etched away in the contact areas.

Figure 4:
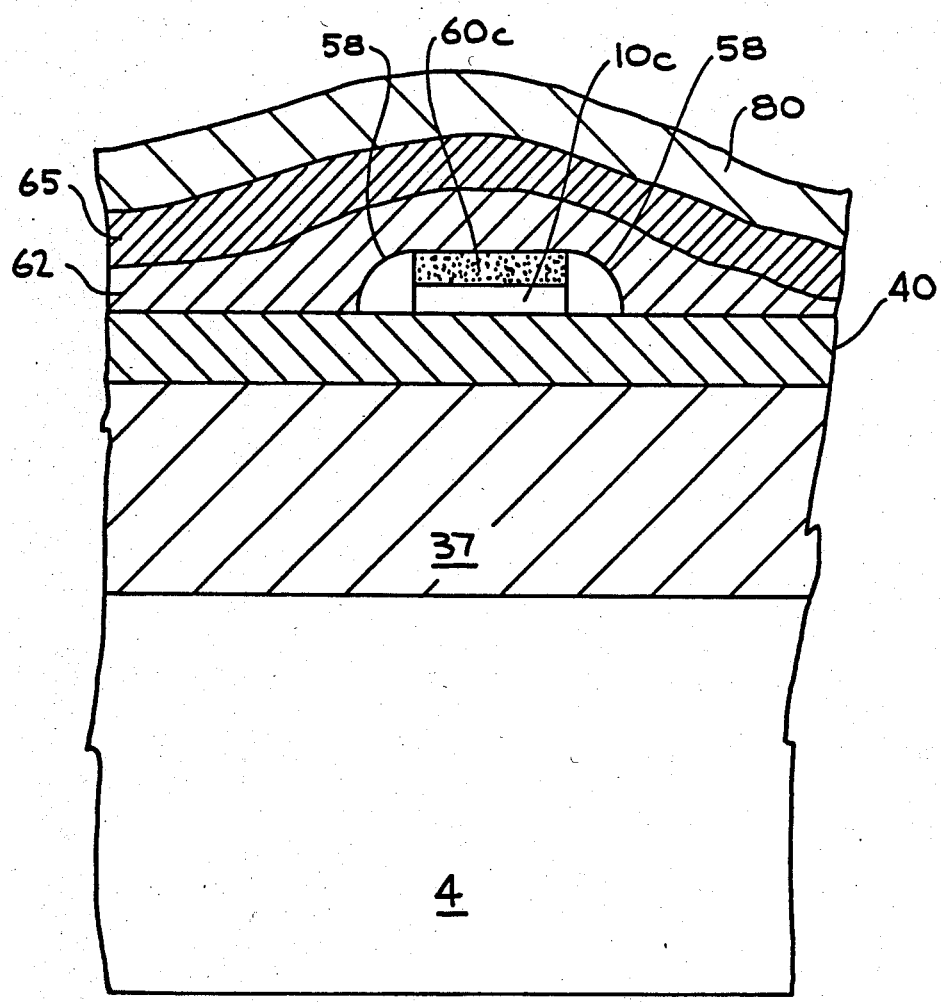
FIG. 4 is sectional end view of the structure of FIG. 1A taken along lines IV—IV.

It should be further noted here that a high selectivity etch will be used on this oxide film which will stop at the densified oxide layer 40 beneath. Using an anisotropic plasma etch, the rounded oxide portions 58 as best seen in FIG. 4 will be formed adjacent the edges of the polysilicon segments or strips, thus further smoothing out the geometry of the layers resulting in better step coverage.

Figure 2G:
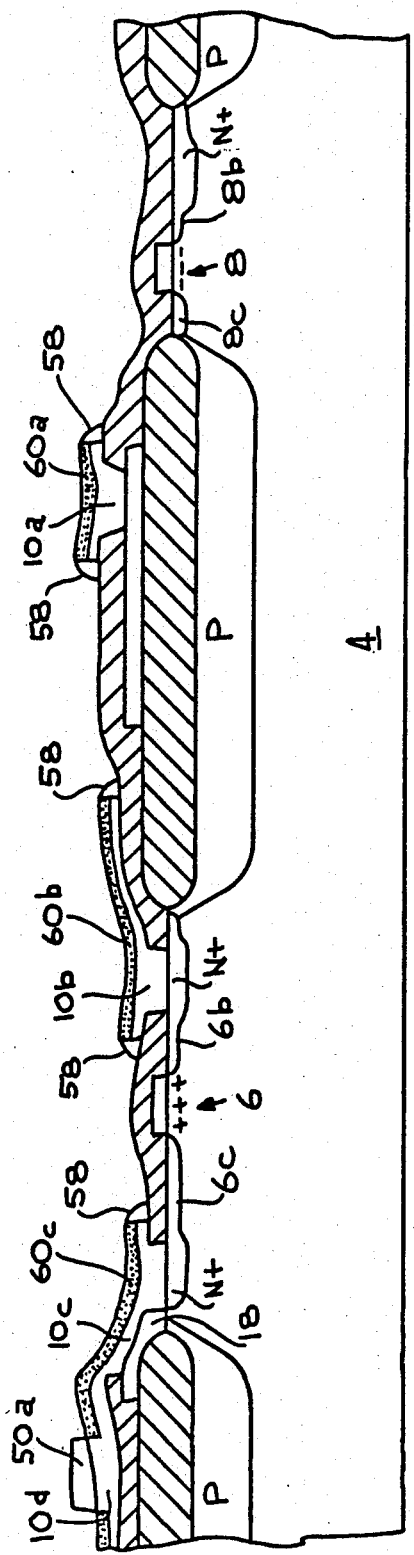

In FIG. 2G, a layer of a refractory metal, such as titanium, has been applied, for example, by sputtering. In accordance with the invention, the wafer is then sintered causing the titanium to react with a majority of the underlying polysilicon segments to form a metal silicide, e.g., titanium silicide segments 60a, 60b, and 60c, in situ on the surface of the remaining polysilicon segments 10a, 10b, and 10c. In those portions where there is no underlying polysilicon, e.g., portion 50a of CVD oxide over poly load resistor 10d, no metal silicide will form, and the metal will remain in metallic form. This metal is then selectively removed from the substrate with an acid and/or base etch, such as a solution of ammonium hydroxide, hydrogen peroxide, and water.

Thus, the formation over all of the poly silicon, except for the portion covered by the CVD oxide, of a silicide layer or strip above this polysilicon layer (which has been previously lightly doped to provide a preselected resistivity and patterned to provide polysilicon strips) results in the effective segregation or separation of one or more portions of the entire doped polysilicon strip or line to form poly load resistor 10d out of only that portion of the doped polysilicon under CVD oxide 50a. In essence, then the remainder of the high resistance polysilicon strip is shorted out by the application of the low resistance silicide (conductive) layer over it.

The final product, as illustrated in FIG. 1A, includes the application of a further oxide layer 62 of PVX which is doped to lower its melting point. This layer serves as a dielectric between the metal silicide and a further metal layer 65 which may be aluminum. Before masking, the device may be heated to a temperature of from about 900°-950° C. to soften the PVX oxide to smooth out the step coverage. The PVX oxide layer is then masked and selectively etched to provide contacts 65b and 65c between polysilicon segment 12 and metal silicide/polysilicon segments 60b/10b as well as provide contact 65a to the N+ region adjacent source 8b of depletion mode FET 8. A metal layer 65 of aluminum or aluminum silicon is then applied and, after masking, etched to form contacts 65a, 65b and 65c. A protective oxide layer 80 is then applied in a final fabrication step prior to testing, mounting and attachment of leads.

Figure 3:
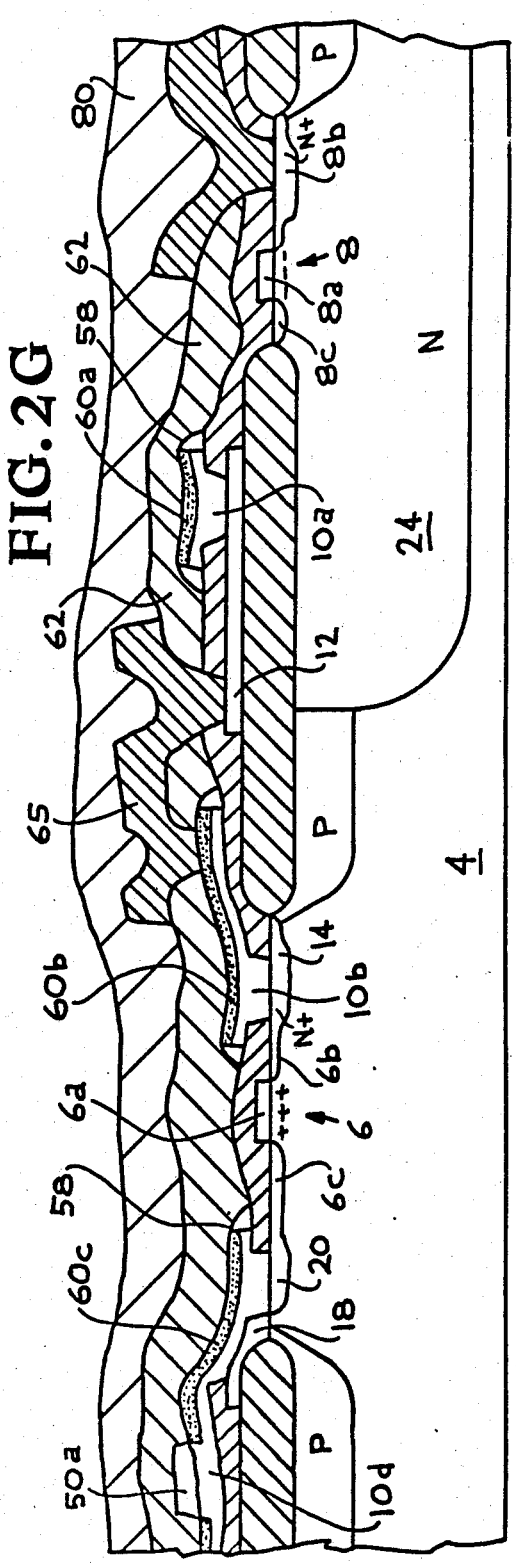
FIG. 3 is a sectional view of a portion of a CMOS device constructed in accordance with the invention.

FIG. 3 illustrates the invention as embodied in a CMOS device having an N well 24 in which a P channel device 8' is formed having a source 8b', a drain 8c', and a gate 8a'. Parameters for such a device are also listed in the Appendices.

If an N channel process is used rather than CMOS technology, the lower melting point of the PVX oxide can also be used to permit the rounding or sloping of the edge 62a of the etched contact openings for contacts 65a, 65b and 65c to provide better metal fill in and avoid thinning of the sidewalls of the metal contact. This also provides better step coverage and planarization of the surface. However, the dopant in the PVX layer must be the same as that used for the source and drain since heating the PVX after opening the contacts can result in some of the dopant from the PVX entering the openings and depositing on the doped substrate.

It should also be noted in this regard that the overall topology with respect to contacts 65a, 65b and 65c is further enhanced by the elimination of the intermediate silicon dioxide layer 50 of prior art FIG. 1B except for CVD portion 50a over the poly load resistor 10d. This results in contacts 65a, 65b and 65c needing to only penetrate two thicknesses of oxide rather than three.

Thus, the invention provides a device wherein the use of an intermediate silicide layer formed in situ in the surface of a polysilicon layer eliminates stepping between a metal layer and a silicide layer and permits subsequent higher temperature processing to provide better step coverage. Furthermore, by providing the silicide layer above the polysilicon layer or strips, and therefore the silicide portion of the contacts for the poly load resistor above the polysilicon, the CVD layer, used in the prior art to protect the poly load resistor from external doping, can be, in essence, eliminated by leaving the CVD oxide, after the anisotropic etching, only above the poly load resistor (except for the rounded portions of CVD oxide adjacent the polysilicon strips). This was not feasible when the silicide, including the silicide interface between the metal contacts and the poly load resistor, was beneath the polysilicon layer. This elimination of an intermediate layer of oxide, except over the poly load resistor, further enhances the topology adjacent the contact areas by reducing the number of oxide layers, and hence the total thickness, which the metal contacts must penetrate.

While the invention has been described with respect to its preferred embodiments, minor modifications may be made which do not depart from the scope of the invention which is defined by the appended claims.

| Appendix 1 - Implantation Parameters | | |
|---|---|---|
| Region | Depth | Dopant (molecules/cm$^3$) |
| channel stop 36 | 1 micron | $10^{16}$–$10^{17}$ B |
| enhancement 32 | 1 micron | $10^{16}$ B |
| depletion 33 | 0.3–0.6 micron | $10^{16}$–$10^{17}$ As |
| source/drain 8b, 8c | 0.2–0.4 micron | $10^{20}$ As (N dopant) |
| *source/drain 8b', 8c' | 0.3–0.5 micron | $10^{20}$ B (P dopant) |
| *N well 24 | 4.0 micron | $10^{16}$ P |

| Appendix 2 - Layer Parameters | | |
|---|---|---|
| Layer | Thickness | Dopant (molecules/cm$^3$) |
| barrier oxide | 200–700 Å | |
| nitride 30a, 30b | 500–1000 Å | |
| field oxide 37 | 0.7–1 micron | |
| implant oxide | 100 Å | |
| gate oxide | 300 Å | |
| polysilicon | | |
| gate 7a, 8a | 2.0–0.5 Å | $10^{20}$–$10^{21}$ P |
| *gate 8a' | 0.2–0.5 Å | $10^{20}$–$10^{21}$ P |
| CVD oxide | 0.2–0.5 micron | |
| metal silicide 60a, 60b, 60c | 0.1–0.3 micron | |
| polysilicon 10a, 10b, 10c | 0.1–0.3 | $10^{19}$ As |
| PVX oxide 62 | 0.5–1.0 micron | 4–8% P |

| Appendix 3 - Electrical Characteristics | |
|---|---|
| Layer/Region | Resistivity (ohms/square) |
| source/drain | 40 |
| polysilicon gates | 30 |
| metal silicide 60a, 60b, 60c | 5 |
| polysilicon 10a, 10b, 10c | $10^9$ |

*for CMOS device

Having thus described the invention, what is claimed is:

1. An improved integrated circuit structure having enhanced step coverage comprising a base layer of silicon, a first oxide layer on said substrate, a layer of polysilicon thereon doped with a dopant to provide a predetermined resistivity and patterned to provide one or more doped polysilicon strips having selected portions thereof reacted with a metal capable of forming a metal silicide in situ in said polysilicon strips, a further oxide layer over said metal silicide, and a metal layer providing electrical contact to selected portions of said structure, said enhanced step coverage being provided by the elimination of an intermediate metal layer by the formation of said metal silicide in said polysilicon strips.

2. The structure of claim 1 wherein said one or more doped polysilicon strips have rounded portions of oxide adjacent the edges of said strips formed by the deposition of a second, oxide layer over said strips followed by anisotropic etching of said second oxide layer, said rounded portions further enhancing the step coverage of said structure.

3. The structure of claim 2 wherein said anisotropic etching of said second oxide layer removes all of said second oxide layer except for said rounded edges, and one or more preselected portions above said polysilicon layer which permit formation of a poly load resistor beneath each of said preselected oxide portions, whereby said structure is further characterized by the substantial absence of one of the oxide layers above said silicon layer thereby providing further enhancement of the step coverage.

4. The structure of claim 3 wherein said metal silicide is formed in portions of said polysilicon strips not covered by said preselected portions of said second oxide to form one or more conductive strips whereby polysilicon portions beneath said preselected oxide portions do not react with said metal capable of forming a metal silicide thus forming poly load resistors out of said unreacted portions of said polysilicon beneath said preselected oxide portions, said poly load resistors being electrically connected at each end thereof to one of said conductive metal silicide strips.

5. An integrated circuit device having enhanced step coverage comprising: a silicon substrate; at least one oxide layer on at least a portion of said silicon substrate; one or more strips of polysilicon thereon doped to provide a selected resistivity; rounded corners of oxide adjacent the edges of said strips formed by depositing a second oxide layer of silicon dioxide over said strips followed by anisotropic etching of said second oxide layer to remove all of said second oxide layer except said rounded portions and one or more preselected portions above said polysilicon strips to form insulation portions over said polysilicon strips; a layer of metal silicide formed in portions of said polysilicon layer not covered by said second oxide insulation portions, whereby poly load resistors are formed beneath said preselected oxide insulation portions of said second oxide layer, said metal silicide comprising a conductive material providing electrical coupling between selected portions of said device, including the ends of said poly load reistors; a further oxide layer overlying said metal silicide; and a metal layer over said further oxide layer; said device having improved step coverage made possible by said rounded oxide edges, substantial removal of said second oxide layer, and replacement of an intermediate metal layer by said metal silicide layer whereby said device may be heated prior to application of said metal contact layer to soften at least a portion of said further oxide layer to smooth the coverage over steps formed in said device.

6. An integrated circuit device having improved step coverage, said improvement comprising:
 (a) an intermediate metal silicide layer formed by depositing, on a layer of polysilicon, a refractory metal selected from the group consisting of titanium, molybdenum, and tungsten and capable of reacting with said silicon, after heating the device to a temperature of from 600°–800° C. for from 10 to 20 seconds, to form a metal silicide in an amount sufficient, with respect to the layer of polysilicon, to leave a layer of polysilicon below the metal silicide layer of from 0.25 to 0.33 the thickness of said metal silicide after reaction of all of said refractory metal to form said metal silicide to thereby strengthen said metal silicide layer; and
 (b) an oxide layer over said silicide layer which has been heated to soften a portion of said oxide layer to smooth out the step coverage by said oxide of underlying layers; said metal silicide having a melting point sufficiently high to permit said softening of said oxide layer without melting said metal silicide layer.

7. The structure of claim 6 wherein said layer of polysilicon comprises a doped polysilicon which has been doped with a dopant selected from the class consisting of phosphorous, boron, and arsenic to provide a preselected resistivity and patterned to form one or more polysilicon strips having round corners of oxide formed on the edges of the polysilicon strips by depositing a second oxide layer of silicon dioxide over said one or more polysilicon strips and selectively removing portions of said second oxide layer by anisotropic etching to form said round corners adjacent said polysilicon strips to enhance subsequent step coverage.

8. The structure of claim 7 wherein said one or more doped polysilicon strips comprise one or more resistors on said integrated circuit device each having a portion of said second oxide layer left over said polysilicon strip after said anisotropic etching whereby subsequent formation of said silicide layer results in the formation of a poly load resistor beneath each of said preselected portions of said oxide thus providing further enhancement of said step coverage by the removal of a majority of said second layer of oxide from the resulting device.

9. The structure of claim 8 wherein said metal silicide forms one or more conductive paths on said resistive polysilicon strips except where said preselected portions of said second oxide layer remain whereby said structure includes poly load resistors formed in said polysilicon strips under said preselected second oxide portions and connected adjacent the ends thereof to said conductive silicide paths.

10. An integrated circuit structure having enhanced step coverage which comprises:
(a) field oxide portions formed over a portion of a silicon substrate;
(b) one or more polysilicon strips formed over said field oxide portions and doped with a dopant to provide a preselected resistivity;
(e) one or more first segments of an oxide layer formed over one or more selected areas of said polysilicon strips corresponding to one or more desired resistors;
(f) rounded portions of oxide at the edges of said polysilicon strips to facilitate subsequent step coverage over said structure, said rounded portions of oxide formed together with said one or more first segments of oxide by isotropically etching an oxide layer applied to said structure over said polysilicon strips;
(g) metal silicide conductive portions formed over portions of said polysilicon strips not covered by said oxide by depositing, on said structure, a layer of a refractory metal selected from the group consisting of titanium, molybdenum, and tungsten and capable of reacting with said polysilicon to form a metal silicide in an amount sufficient, with respect to the thickness of said polysilicon strips thereunder, to leave a layer of polysilicon below the metal silicide layer of from 0.25 to 0.33 the thickness of said metal silicide after reaction of all of the refractory metal to form said metal silicide to thereby strengthen said metal silicide layer and heating said structure to a temperature of from 600°–800° C. for from 10 to 20 seconds sufficient to form said silicide whereby conductive portions of metal silicide are formed between said selected areas of said doped polysilicon strips comprising said one or more resistors beneath said oxide segments to thereby provide electrical connection to said one or more resistors; and
(i) a layer of a doped oxide formed over said structure and heated to permit said doped oxide to flow over the steps of said structure whereby said rounded portions of oxide on the edges of said polysilicon strips facilitate formation of smooth step coverage by said doped oxide over said structure;

whereby said metal silicide formed over portions of a doped polysilicon layer having segments masked with oxide to form resistors between the metal silicide and said formation of rounded oxide portions on the edges of said polysilicon strips provide a structure with enhanced step coverage by a doped second oxide layer subsequently formed over said structure by the consolidation of conductive, resistive, and insulating layers and by permitting the heating of said doped second oxide layer without interfering with underlying metal layers.

* * * * *